United States Patent
Akahori

(10) Patent No.: US 10,923,173 B2
(45) Date of Patent: Feb. 16, 2021

(54) VOLTAGE GENERATING CIRCUIT, SEMICONDUCTOR MEMORY DEVICE, AND VOLTAGE GENERATING METHOD

(71) Applicant: LAPIS SEMICONDUCTOR CO., LTD, Yokohama (JP)

(72) Inventor: Akira Akahori, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/438,498

(22) Filed: Jun. 12, 2019

(65) Prior Publication Data
US 2019/0385659 A1 Dec. 19, 2019

(30) Foreign Application Priority Data

Jun. 13, 2018 (JP) .............................. JP2018-113132

(51) Int. Cl.
| | | |
|---|---|---|
| *G11C 11/4074* | (2006.01) | |
| *H02M 3/07* | (2006.01) | |
| *G11C 5/14* | (2006.01) | |
| *G11C 16/30* | (2006.01) | |
| *G11C 16/26* | (2006.01) | |
| *G11C 11/413* | (2006.01) | |

(52) U.S. Cl.
CPC .......... *G11C 11/4074* (2013.01); *G11C 5/145* (2013.01); *G11C 11/413* (2013.01); *G11C 16/26* (2013.01); *G11C 16/30* (2013.01); *H02M 3/073* (2013.01); *H02M 2003/076* (2013.01)

(58) Field of Classification Search
CPC ............ G05F 3/00; G05F 3/205; H02M 1/00; H02M 1/08; H02M 2003/00; H02M 2003/071; H02M 2003/076; H02M 2003/077; H02M 3/00; H02M 3/07; H02M 3/073; G11C 11/00; G11C 11/4074; G11C 11/413; G11C 16/00; G11C 16/26; G11C 16/30; G11C 5/00; G11C 5/145; G11C 5/147; G11C 7/00; G11C 7/222
USPC .......................................................... 327/536
See application file for complete search history.

(56) References Cited

U.S. PATENT DOCUMENTS

| | | | | |
|---|---|---|---|---|
| 6,333,873 B1 * | 12/2001 | Kumanoya | ............ | G11C 5/145 365/149 |
| 2006/0170485 A1 * | 8/2006 | Menke | ..................... | H02M 3/07 327/536 |

FOREIGN PATENT DOCUMENTS

JP      H11299227      10/1999

* cited by examiner

*Primary Examiner* — Lincoln D Donovan
*Assistant Examiner* — Dave Mattison
(74) *Attorney, Agent, or Firm* — JCIPRNET

(57) ABSTRACT

A voltage generating circuit, a semiconductor memory device, and a voltage generating method are provided. The voltage generating circuit includes: an oscillation signal generating part generating an oscillation signal that alternately repeats a state of a first voltage and a state of a second voltage; a capacitor having one end receiving the oscillation signal and an other end connected to an output node; a switch element receiving a control voltage and set to an on state or an off state according to the control voltage, and applying the first voltage to the output node when set to the on state; and a switch control part supplying, as the control voltage to the switch element, the second voltage when the oscillation signal is in the state of the first voltage, and a voltage of the output node when the oscillation signal is in the state of the second voltage.

8 Claims, 8 Drawing Sheets

VOLTAGE GENERATING CIRCUIT, SEMICONDUCTOR MEMORY DEVICE, AND VOLTAGE GENERATING METHOD

CROSS-REFERENCE TO RELATED APPLICATION

This application claims the benefit of Japan Application No. 2018-113132, filed on Jun. 13, 2018. The entirety of the above-mentioned patent application is hereby incorporated by reference herein and made a part of this specification.

BACKGROUND

Technical Field

The disclosure relates to a voltage generating circuit that generates a voltage having a desired voltage value, a semiconductor memory device including the voltage generating circuit, and a voltage generating method.

Description of Related Art

A semiconductor memory device is provided with a voltage generating circuit that generates various positive and negative voltages to be applied to memory cells for reading, writing or erasing data.

In addition, serving as such a voltage generating circuit, a charge pump circuit, which is capable of generating not only a positive voltage higher than the power supply voltage but also a negative voltage, is known (for example, refer to FIG. 1 and FIG. 5 of Japanese Laid-Open No. 11-299227 (Patent Document 1)).

In the charge pump circuit, first, the ground voltage (0V) is applied to one end of a capacitor via a MOS type transistor that serves as a switch means. In the meantime, a power supply voltage of 5V is further applied to the other end of the capacitor to charge the capacitor. Subsequently, the above transistor is switched to the off state and the power supply voltage applied to the other end of the capacitor is switched to the ground voltage, so as to generate a voltage of −5V as the negative voltage at one end of the capacitor.

Since the source of the above transistor is connected to one end of the capacitor, a voltage of −5V is applied to the source of the transistor. Therefore, to set the transistor to the off state, it is necessary to apply a control voltage of −5V or less to its gate.

Thus, in order to set the transistor to the off state, the above charge pump circuit is provided with a level conversion circuit, which converts the control voltage supplied to the gate of the transistor from the ground voltage (0V) to −5V.

Therefore, when a charge pump circuit is used as the voltage generating circuit, it is required to dispose a level conversion circuit to reliably control on/off of the transistor that is responsible for the charge pump operation, which increases the circuit scale and power consumption.

SUMMARY

A voltage generating circuit according to the disclosure is a voltage generating circuit for generating a DC (direct current) voltage at an output node. The voltage generating circuit includes: an oscillation signal generating part generating an oscillation signal that alternately repeats a state of a first voltage and a state of a second voltage; a capacitor having one end receiving the oscillation signal and an other end connected to the output node; a switch element receiving a control voltage and set to an on state or an off state according to the control voltage, and applying the first voltage to the output node when set to the on state; and a switch control part setting the switch element to the off state by supplying the second voltage as the control voltage to the switch element when the oscillation signal is in the state of the first voltage, and setting the switch element to the on state by supplying a voltage of the output node as the control voltage to the switch element when the oscillation signal is in the state of the second voltage.

Further, a voltage generating circuit according to the disclosure is a voltage generating circuit for generating a DC voltage at an output node. The voltage generating circuit includes: an oscillation signal generating part generating a first oscillation signal that alternately repeats a state of a first voltage and a state of a second voltage, and a second oscillation signal obtained by inverting a phase of the first oscillation signal; first and second nodes; a first capacitor having one end receiving the first oscillation signal and an other end connected to the first node; a second capacitor having one end receiving the second oscillation signal and an other end connected to the second node; a first switch element set to an on state or an off state according to a first control voltage and applying the first voltage to the first node when set to the on state; a second switch element set to an on state or an off state according to a second control voltage and applying the first voltage to the second node when set to the on state; a first switch control part setting the first switch element to the off state by supplying the second voltage as the first control voltage to the first switch element when the first oscillation signal is in the state of the first voltage, and setting the first switch element to the on state by supplying a voltage of the second node as the first control voltage to the first switch element when the first oscillation signal is in the state of the second voltage; a second switch control part setting the second switch element to the off state by supplying the second voltage as the second control voltage to the second switch element when the second oscillation signal is in the state of the first voltage, and setting the second switch element to the on state by supplying a voltage of the first node as the second control voltage to the second switch element when the second oscillation signal is in the state of the second voltage; a first output switch element being in an on state only when the first control voltage is in the state of the second voltage, and applying the voltage of the first node to the output node; and a second output switch element being in an on state only when the second control voltage is in the state of the second voltage, and applying the voltage of the second node to the output node.

Further, a voltage generating circuit according to the disclosure is a voltage generating circuit for generating a DC voltage at an output node. The voltage generating circuit includes: an oscillation signal generating part generating a first oscillation signal that alternately repeats a state of a first voltage and a state of a second voltage, a second oscillation signal that advances a phase of a rising edge of the first oscillation signal by a predetermined time, a third oscillation signal obtained by inverting a phase of the first oscillation signal, and a fourth oscillation signal that advances a phase of a rising edge of the third oscillation signal by a predetermined time; first and second nodes; a first capacitor having one end receiving the first oscillation signal and an other end connected to the first node; a second capacitor having one end receiving the third oscillation signal and an other end connected to the second node; a first switch element set to an on state or an off state according to a first control voltage and applying the first voltage to the first node when set to the on state; a second switch element set to an on state or an off state according to a second control voltage and applying the first voltage to the second node when set to the on state; a first switch control part setting the first switch element to the off state by supplying the second voltage as the first control voltage to the first switch element when the second oscillation signal is in the state of the first voltage, and setting the first switch element to the on state by supplying a voltage of the second node as the first control voltage to the first switch element when the second oscillation signal is in the state of the second voltage; a second switch control part setting the second switch element to the off state by supplying the second voltage as the second control voltage to the second switch element when the fourth oscillation signal is in the state of the first voltage, and setting the second switch element to the on state by supplying a voltage of the first node as the second control voltage to the second switch element when the fourth oscillation signal is in the state of the second voltage; a first output switch element being in an on state only when the first control voltage is in the state of the second voltage, and applying the voltage of the first node to the output node; and a second output switch element being in an on state only when the second control voltage is in the state of the second voltage, and applying the voltage of the second node to the output node.

A semiconductor memory device according to the disclosure is a semiconductor memory device, including: a plurality of memory cells; and a voltage generating circuit generating a voltage for writing data to or reading data from the memory cells, wherein the voltage generating circuit includes: an oscillation signal generating part generating an oscillation signal that alternately repeats a state of a first voltage and a state of a second voltage; a capacitor having one end receiving the oscillation signal and an other end connected to an output node; a switch element receiving a control voltage and set to an on state or an off state according to the control voltage, and applying the first voltage to the output node when set to the on state; and a switch control part setting the switch element to the off state by supplying the second voltage as the control voltage to the switch element when the oscillation signal is in the state of the first voltage, and setting the switch element to the on state by supplying a voltage of the output node as the control voltage to the switch element when the oscillation signal is in the state of the second voltage.

A voltage generating method according to the disclosure is a voltage generating method of a voltage generating circuit, which includes an oscillation signal generating part generating an oscillation signal that alternately repeats a state of a first voltage and a state of a second voltage; a capacitor having one end receiving the oscillation signal and an other end connected to an output node; and a switch element receiving a control voltage and set to an on state or an off state according to the control voltage, and applying the first voltage to the output node when set to the on state. The voltage generating method includes: setting the switch element to the off state by supplying the second voltage as the control voltage to the switch element when the oscillation signal is in the state of the first voltage; and setting the switch element to the on state by supplying a voltage of the output node as the control voltage to the switch element when the oscillation signal is in the state of the second voltage.

DESCRIPTION OF THE EMBODIMENTS

The disclosure provides a voltage generating circuit, a semiconductor memory device, and a voltage generating method that can prevent the circuit scale and power consumption from increasing.

In the disclosure, the oscillation signal that alternately repeats the state of the first voltage and the state of the second voltage is supplied to one end of the capacitor. The output node at which the DC voltage is generated is connected to the other end of the capacitor.

Furthermore, in the disclosure, the switch element, which is in the off state when the oscillation signal is in the state of the first voltage and is in the on state to apply the first voltage to the output node when the oscillation signal is in the state of the second voltage, is controlled as follows by the switch control part, so as to generate the DC voltage at the output node.

That is, when the oscillation signal is in the state of the first voltage, the switch control part sets the switch element to the off state by supplying the second voltage as the control voltage to the switch element. On the other hand, when the oscillation signal is in the state of the second voltage, the switch control part sets the switch element to the on state by supplying the voltage of the output node as the control voltage to the switch element.

With the switch control part, even if the DC voltage generated at the output node is higher or lower than either of the first voltage and the second voltage, it is possible to reliably set the switch element to the on state or the off state. Furthermore, since the switch control part can be configured by an inverter composed of a pair of transistors that receive the above oscillation signal with the respective gates, it is possible to reduce the circuit scale and power consumption.

Hereinafter, embodiments of the disclosure will be described in detail with reference to the drawings.

Figure 1:
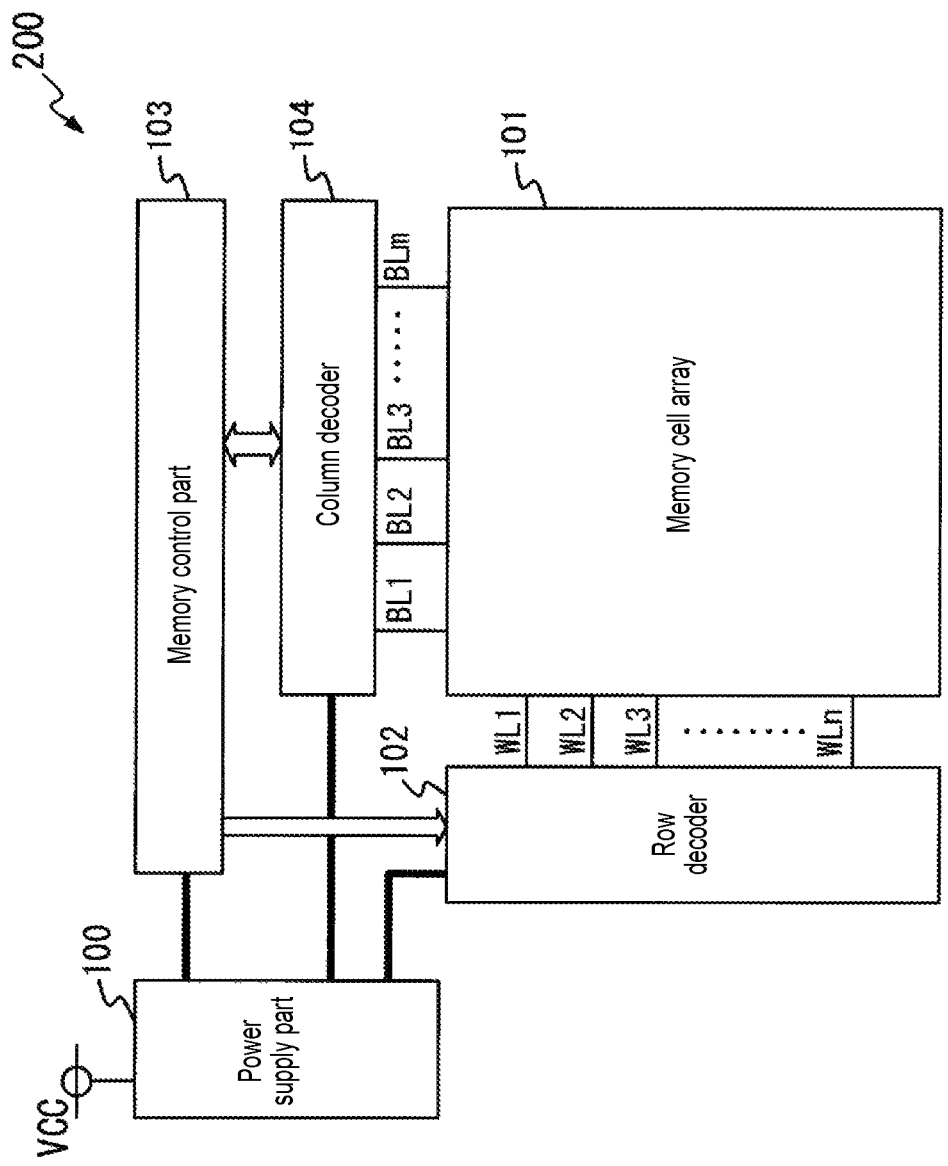
FIG. 1 is a block diagram showing a schematic configuration of the semiconductor memory device 200 including the voltage generating circuit according to the disclosure.

FIG. 1 is a block diagram showing a schematic configuration of a semiconductor memory device 200 including a voltage generating circuit according to the disclosure. The semiconductor memory device 200 includes a power supply part 100, a memory cell array 101, a row decoder 102, a memory control part 103, and a column decoder 104.

The memory cell array 101 includes bit lines BL1 to BLm (m is an integer of 2 or more) and word lines WL1 to WLn (n is an integer of 2 or more) arranged to intersect the bit lines BL1 to BLm. Further, memory cells (not shown) are formed at intersections of the bit lines BL and the word lines WL respectively. Each of the memory cells writes and reads binary or multi-value data according to a selection voltage supplied via the word lines WL and a write voltage or a read voltage supplied via the bit lines BL.

The row decoder 102 applies a selection voltage for data reading or writing to the word lines WL1 to WLn of the memory cell array 101 according to a control signal supplied from the memory control part 103.

The column decoder 104 applies a ground voltage, a read voltage or a write voltage to the bit lines BL1 to BLm of the memory cell array 101 according to a control signal supplied from the memory control part 103.

The memory control part 103 supplies various control signals for driving the memory cell array 101 to write, read or erase data to the row decoder 102 and the column decoder 104 according to a memory control signal representing a write command, a read command, etc. and an address from outside.

The power supply part 100 generates an internal power supply voltage for operating the memory control part 103 based on a power supply voltage VCC supplied from an external power supply (not shown), and supplies it to the memory control part 103. In addition, the power supply part 100 generates various voltages for the write voltage, the read voltage, and the erase voltage based on the power supply voltage VCC, and supplies the voltages to the column decoder 104.

Furthermore, the power supply part 100 generates a negative voltage for the selection voltage based on the power supply voltage VCC, and supplies it to the row decoder 102.

Figure 2:
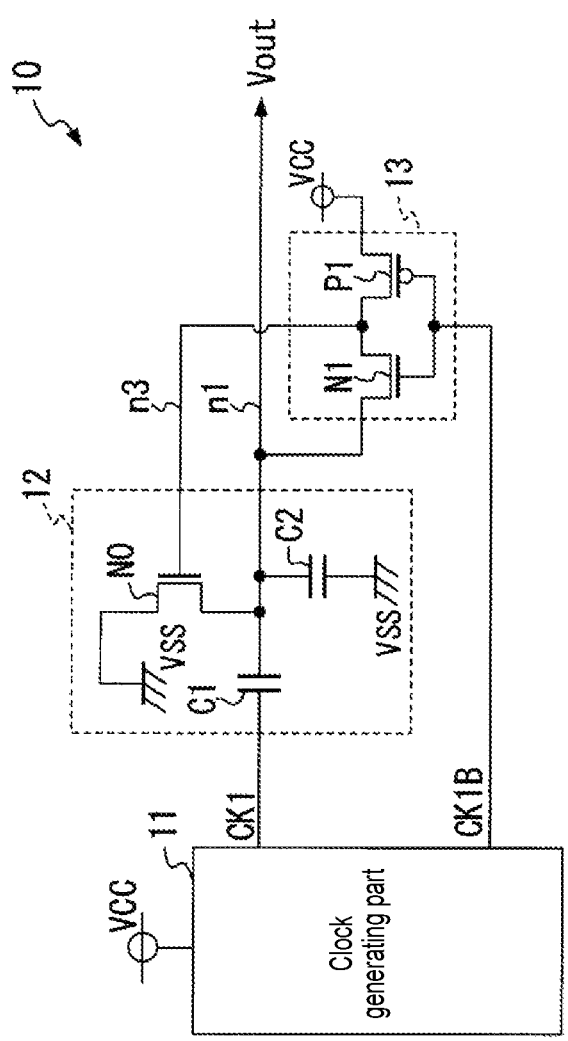
FIG. 2 is a circuit diagram showing an example of the configuration of the voltage generating circuit 10 according to the disclosure.

FIG. 2 is a circuit diagram showing an example of the configuration of a voltage generating circuit 10 that is included in the power supply part 100 and generates a DC voltage Vout as the negative voltage for the selection voltage, for example.

As shown in FIG. 2, the voltage generating circuit 10 includes a clock generating part 11, a negative voltage generating part 12, and a switch control part 13.

The clock generating part 11 generates a clock signal CK1 and a clock signal CK1B, which is a so-called inverse phase signal obtained by inverting the phase of the clock signal CK1, as oscillation signals that alternately repeat the state of the positive power supply voltage VCC and the state of the ground voltage VSS (for example, 0V) lower than the power supply voltage VCC, and supplies them to the negative voltage generating part 12 and the switch control part 13.

The negative voltage generating part 12 is a so-called charge pump circuit that includes a n-channel MOS (Metal Oxide Semiconductor) type transistor N0 and capacitors C1 and C2.

The capacitor C1 receives the clock signal CK1 at one end thereof. The other end of the capacitor C1 is connected to a node n1. One end of the capacitor C2 is connected to the node n1 and the other end thereof is applied with the ground voltage VSS.

The ground voltage VSS is applied to the source of the transistor N0, and the drain thereof is connected to the node n1. The gate of the transistor N0 is connected to the switch control part 13 via a node n3.

The switch control part 13 includes a p-channel MOS type transistor P1 and a n-channel MOS type transistor N1.

The gates of the transistors P1 and N1 receive the clock signal CK1B which is the inverse phase signal of the clock signal CK1. The drains of the transistors P1 and N1 are connected to the gate of the transistor N0 of the negative voltage generating part 12 via the node n3. The source of the transistor N1 is connected to the node n1 and the source of the transistor P1 is applied with the power supply voltage VCC.

An operation of the voltage generating circuit 10 shown in FIG. 2 will be described below.

First, in a state where the node n1 has a negative voltage, while the clock signal CK1 is in the state of the power supply voltage VCC (hereinafter also referred to as the state of a logic level 1), the capacitor C1 is charged according to the clock signal CK1. In the meantime, the clock signal CK1B is the ground voltage VSS. Thus, the transistor P1 is in the on state according to the clock signal CK1B, and the power supply voltage VCC is applied as the control voltage to the gate of the transistor N0 via the transistor P1 and the node n3. Therefore, the transistor N0 is in the on state and the ground voltage VSS is applied to the node n1 via the transistor N0.

Thereafter, when the clock signal CK1 transitions from the state of the power supply voltage VCC to the state of the ground voltage VSS (hereinafter also referred to as the state of a logic level 0), the capacitor C1 discharges and the voltage of the node n1 drops. As a result, the voltage of the node n1 becomes a negative state. The capacitor C2 maintains the state of the negative voltage of the node n1. In the meantime, the clock signal CK1B is the power supply voltage VCC. Thus, the transistor N1 is in the on state according to the clock signal CK1B, and the voltage of the node n1, which is a negative voltage, is applied as the control voltage to the gate of the transistor N0 via the transistor N1 and the node n3. Therefore, the transistor N0 is in the off state.

As described above, in the voltage generating circuit 10 shown in FIG. 2, the above series of operations are repeatedly performed according to the clock signal CK1 and the clock signal CK1B, which is the inverse phase signal of the clock signal CK1, so as to generate a negative voltage at the node n1 and output it as the DC voltage Vout. In addition, the negative voltage value of the voltage Vout can be set to any voltage value by the capacitances of the capacitors C1 and C2.

Here, in order to reliably set the transistor N0 connected to the node n1, which is in the state of a negative voltage, to the on state and the off state, an inverter configuration composed of the transistors P1 and N1 is adopted in the switch control part 13 shown in FIG. 2.

That is, while the clock signal CK1B is in the state of the logic level 1, the transistor N1 of the transistors P1 and N1 is in the on state, and the negative voltage is supplied as the control voltage to the gate of the transistor N0 via the transistor N1 and the node n3. At this time, although the negative voltage of the node n1 is applied to the drain of the transistor N0, the voltage of the node n1, which is a negative voltage, is applied to the gate of the transistor N0, so the transistor N0 is reliably set to the off state and its state is maintained.

On the other hand, while the clock signal CK1B is in the state of the logic level 0, the transistor P1 of the transistors P1 and N1 is in the on state, and VCC, which is the power supply voltage of the node n1, is supplied as the control voltage to the gate of the transistor N0 via the transistor P1 and the node n3. At this time, since VCC, which is the power supply voltage, is applied to the gate, the transistor N0 is reliably set to the on state.

As described above, in the voltage generating circuit 10, the transistor N0, which is in the off state when the clock signal CK1B is in the state of the power supply voltage VCC and is in the on state to apply the ground voltage VSS to the node n1 when the clock signal CK1B is in the state of the ground voltage VSS, so as to generate a DC negative voltage at the node n1, is controlled as follows.

That is, when CK1B, which is the inverse phase signal of the clock signal CK1, is in the state of the power supply voltage VCC, the switch control part 13 supplies the voltage of the node n1 as the control voltage to the gate of the transistor N0, so as to set the transistor N0 to the off state. On the other hand, when the clock signal CK1B is in the state of the ground voltage VSS, the switch control part 13 supplies the power supply voltage VCC as the control voltage to the gate of the transistor N0, so as to set the transistor N0 to the on state.

With such a switch control part, even if the DC voltage generated at the output node is a negative voltage lower than the ground voltage VSS, it is still possible to reliably set the transistor N0 to the off state. Furthermore, as shown in FIG. 2, since the switch control part 13 can be configured by the inverter composed of a pair of transistors (P1 and N1) that receives CK1B, which is the inverse phase signal of the clock signal CK1, with the respective gates, it is possible to reduce the circuit scale and power consumption.

Figure 3:
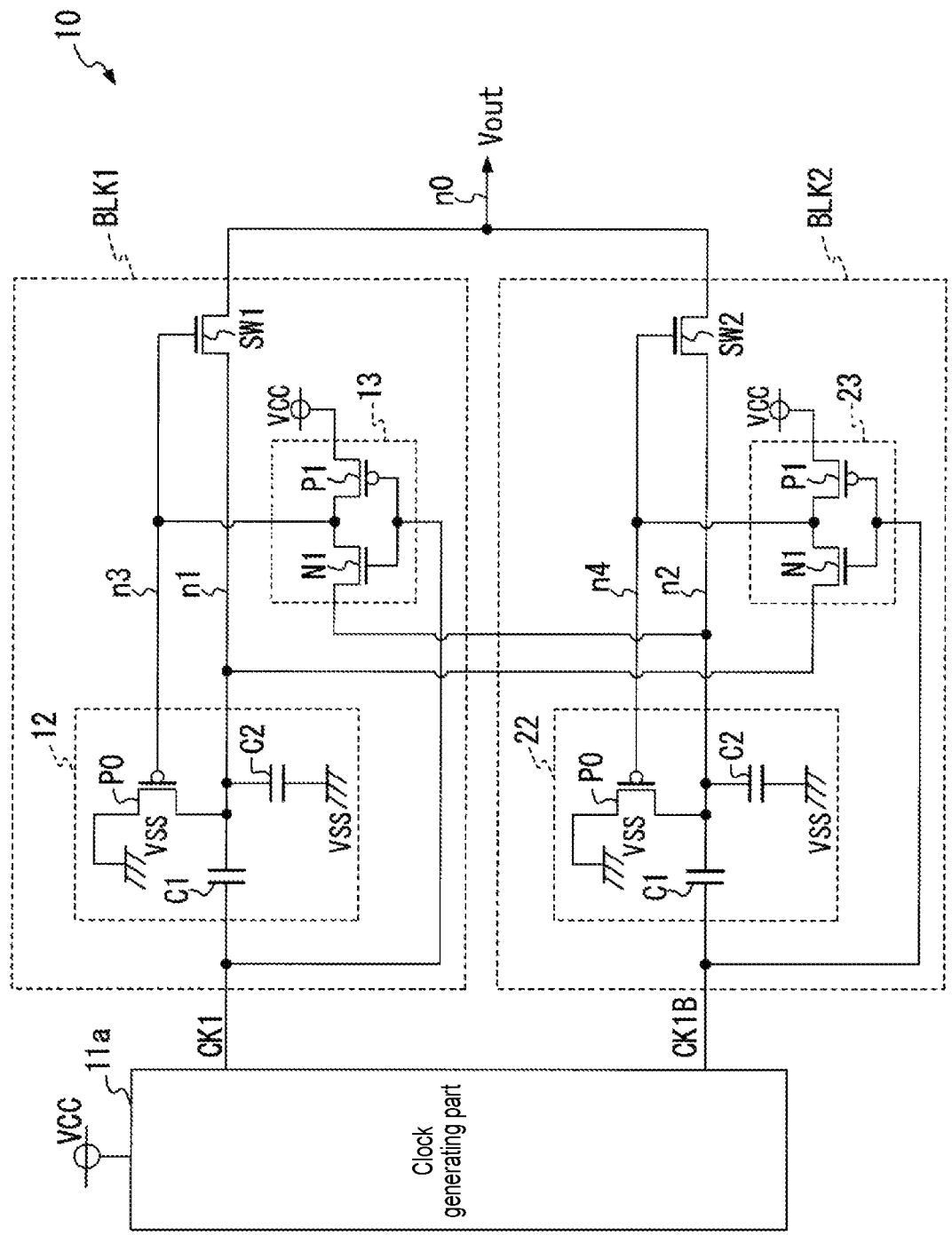
FIG. 3 is a circuit diagram showing another example of the configuration of the voltage generating circuit 10.

FIG. 3 is a circuit diagram showing another example of the configuration of the voltage generating circuit 10.

The voltage generating circuit 10 shown in FIG. 3 includes a clock generating part 11a and first and second circuit blocks BLK1 and BLK2.

As shown in FIG. 3, the clock generating part 11a generates a clock signal CK1 as an oscillation signal that alternately repeats the state of the positive power supply voltage VCC and the state of the ground voltage VSS (for example, 0V), and supplies it to the first circuit block BLK1.

Furthermore, as shown in FIG. 3, the clock generating part 11a generates a clock signal CK1B as an oscillation signal obtained by inverting the phase of the clock signal CK1, and supplies it to the second circuit block BLK2.

The circuit block BLK1 includes the negative voltage generating part 12 and the switch control part 13 shown in FIG. 2, and a n-channel MOS type transistor SW1. In the circuit block BLK1, the source of the transistor N1 of the switch control part 13 is not connected to the node n1 and is connected to the node n2 included in the circuit block BLK2.

Furthermore, in the circuit block BLK1, the node n1 is connected to the source of the transistor SW1, and the gate of the transistor SW1 is connected to the drains of the transistors P1 and N1 and the gate of the transistor P0 via the node n3. The drain of the transistor SW1 is connected to the node n0.

The circuit block BLK2 includes a negative voltage generating part 22, a switch control part 23, and a n-channel MOS type transistor SW2.

Moreover, the negative voltage generating part 22 has the same circuit configuration as the negative voltage generating part 12, that is, the transistor P0, and the capacitors C1 and C2. The switch control part 23 adopts the same circuit configuration as the switch control part 13, that is, an inverter configuration composed of the transistors P1 and N1.

In the negative voltage generating part 22, the capacitor C1 receives the clock signal CK1B at one end. The other end of the capacitor C1 is connected to the node n2. In addition, one end of the capacitor C2 is connected to the node n2, and the other end thereof is applied with the ground voltage VSS.

Furthermore, in the negative voltage generating part 22, the ground voltage VSS is applied to the drain of the transistor P0, and the source of the transistor P0 is connected to the node n2. Also, the gate of the transistor P0 is connected to the drains of the transistors P1 and N1 of the switch control part 23 and the gate of the transistor SW2 via the node n4.

The above node n2 is connected to the source of the transistor SW2, and the drain thereof is connected to the node n0.

In the switch control part 23, the gates of the transistors P1 and N1 receive the clock signal CK1B. Furthermore, in the switch control part 23, the source of the transistor N1 is connected to the node n1 of the circuit block BLK1, and the source of the transistor P1 is applied with the power supply voltage VCC.

An operation of the voltage generating circuit 10 composed of the configuration shown in FIG. 3 will be described below with reference to the time chart shown in FIG. 4.

Figure 4:
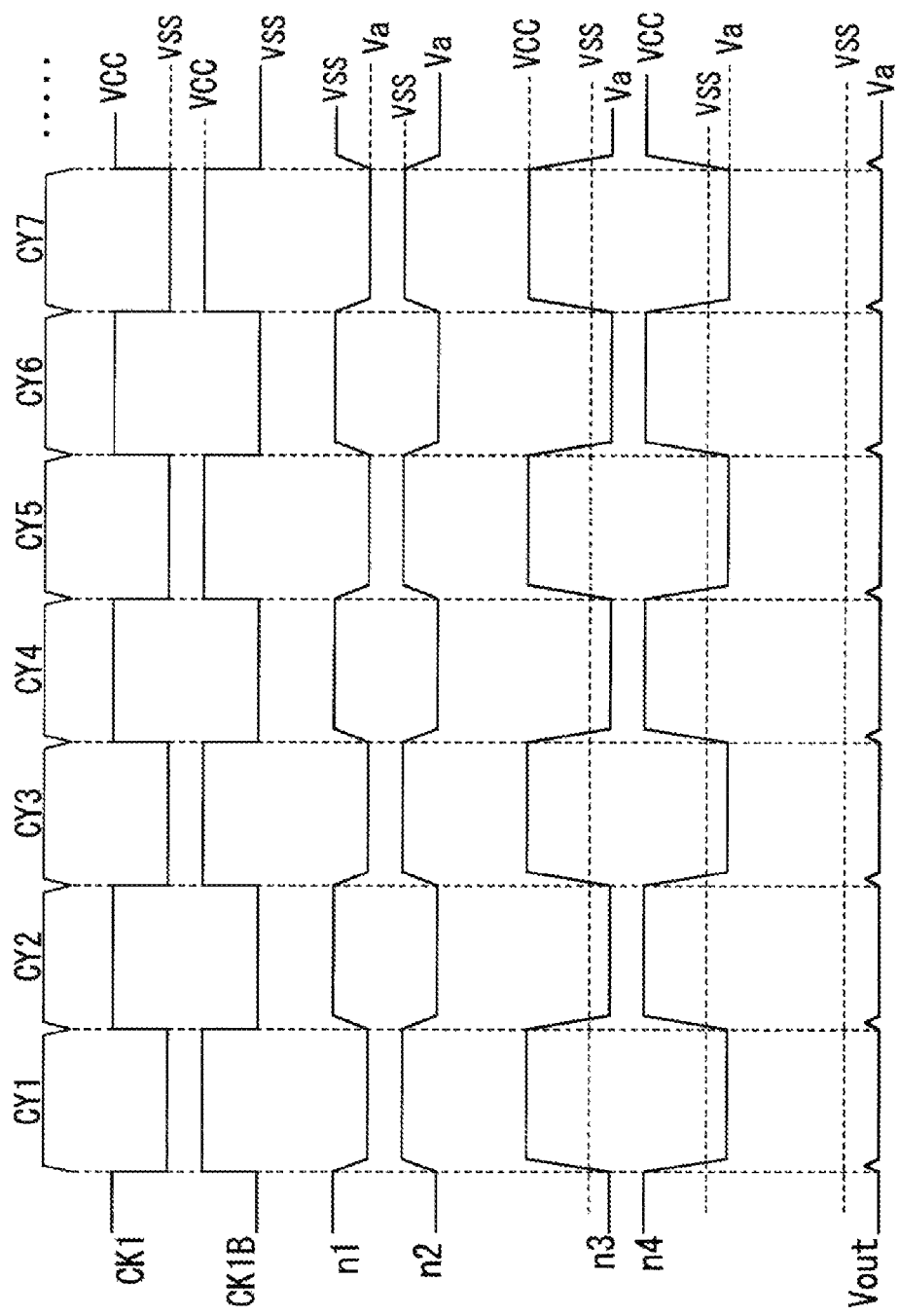
FIG. 4 is a time chart showing an example of the internal operation of the voltage generating circuit 10 shown in FIG. 3.

For example, as shown in FIG. 4, in the even cycles CY2, CY4, CY6, . . . where the clock signal CK1 is in the state of the power supply voltage VCC, the capacitor C1 of the negative voltage generating part 12 included in the circuit block BLK1 is charged according to the clock signal CK1. Further, in the meantime, the transistor N1 of the switch control part 13 is in the on state according to the clock signal CK1. Thus, the voltage of the node n2 of the circuit block BLK2, that is, the control voltage having a negative voltage Va (to be described later), is applied to the gate of the transistor P0 of the negative voltage generating part 12 via the transistor N1 of the switch control part 13 and the node n3. Therefore, the transistor P0 is in the on state, and the ground voltage VSS is applied to the node n1.

That is, as shown in FIG. 4, in the even cycles CY2, CY4, CY6, . . . , the node n1 on the side of the circuit block BLK1 is in the state of the ground voltage VSS and the node n3 is in the state of the negative voltage Va.

Thereafter, when the clock signal CK1 transitions from the state of the power supply voltage VCC to the state of the ground voltage VSS, the capacitor C1 of the negative voltage generating part 12 is discharged and the voltage of the node n1 drops. As a result, the negative voltage Va represented by:

$$Va = -C1u \cdot VCC/(C1u+C2u), \text{ where}$$

C1u: capacitance of C1, and
C2u: capacitance of C2,
is generated at the node n1.

Furthermore, while the clock signal CK1 is in the state of the ground voltage VSS, the transistor P1 of the switch control part 13 is in the on state, and the power supply voltage VCC is applied to the node n3.

Thus, as shown in FIG. 4, in the odd cycles CY1, CY3, CY5, . . . , the node n1 on the side of the circuit block BLK1 is in the state of the negative voltage Va, and the node n3 is in the state of the power supply voltage VCC.

Moreover, in the odd cycles CY1, CY3, CY5, . . . where the clock signal CK1B is in the state of the power supply voltage VCC, the capacitor C1 of the negative voltage generating part 22 included in the circuit block BLK2 is charged according to the clock signal CK1B. Further, in the meantime, the transistor N1 of the switch control part 23 is in the on state according to the clock signal CK1B, and the negative voltage of the node n1 on the side of the circuit block BLK1 is applied as the control voltage to the gate of the transistor P0 of the negative voltage generating part 22 via the transistor N1 of the switch control part 23 and the node n4. Therefore, the transistor P0 is in the on state, and the ground voltage VSS is applied to the node n2 via the transistor P0.

That is, as shown in FIG. 4, in the odd cycles CY1, CY3, CY5, . . . , the node n2 on the side of the circuit block BLK2 is in the state of the ground voltage VSS, and the node n4 is in the state of the negative voltage Va.

Thereafter, when the clock signal CK1B transitions from the state of the power supply voltage VCC to the state of the ground voltage VSS, the capacitor C1 of the negative voltage generating part 22 is discharged and the voltage of the node n2 drops. As a result, the negative voltage Va represented by:

$$Va = -C1u \cdot VCC/(C1u+C2u), \text{ where}$$

C1u: capacitance of C1, and
C2u: capacitance of C2,
is generated at the node n2.

Furthermore, while the clock signal CK1B is in the state of the ground voltage VSS, the transistor P1 of the switch control part 23 is in the on state, and the power supply voltage VCC is applied to the node n4.

Thus, as shown in FIG. 4, in the even cycles CY2, CY4, CY6, . . . , the node n2 on the side of the circuit block BLK2 is in the state of the negative voltage Va, and the node n4 is in the state of the power supply voltage VCC.

Here, as shown in FIG. 4, while the node n3 is in the state of the power supply voltage VCC, the transistor SW1, which serves as the output switch element of the circuit block BLK1, is in the on state. On the other hand, while the node n4 is in the state of the power supply voltage VCC, the transistor SW2, which serves as the output switch element of the circuit block BLK2, is in the on state.

Thus, in the odd cycles CY1, CY3, CY5, . . . shown in FIG. 4, the negative voltage Va generated at the node n1 on the side of the circuit block BLK1 is applied to the node n0 via the transistor SW1.

On the other hand, in the even cycles CY2, CY4, CY6, . . . shown in FIG. 4, the negative voltage Va generated at the node n2 on the side of the circuit block BLK2 is applied to the node n0 via the transistor SW2.

As described above, in the voltage generating circuit 10 shown in FIG. 3, the circuit blocks BLK1 and BLK2 alternately generate the negative voltage Va according to the clock signals CK1 and CK1B. At this time, the circuit blocks BLK1 and BLK2 alternately apply the negative voltage Va generated thereby to the node n0, so as to output the negative voltage Va as the DC voltage Vout.

Thus, in the case where the configuration shown in FIG. 3 is adopted as the voltage generating circuit 10, it is possible to generate a negative DC voltage Vout with suppressed voltage fluctuation, compared to the case where the configuration shown in FIG. 2 is adopted.

Further, even in the voltage generating circuit 10 having the configuration shown in FIG. 3, the same as the configuration shown in FIG. 2, the transistor P0 included in the negative voltage generating part 12 (22) and the transistors SW1 and SW2 that serve as the output switch elements are controlled as follows.

That is, when the clock signal CK1 (CK1B) is in the state of the ground voltage VSS, the switch control part 13 (23) supplies the power supply voltage VCC as the control voltage to the gates of the transistors P0, SW1, and SW2. Therefore, the transistor P0 is set to the off state, and the transistors SW1 and SW2 that serve as the output switch elements are set to the on state. On the other hand, when the clock signal CK1 (CK1B) is in the state of the power supply voltage VCC, the switch control part 13 (23) supplies the voltage of the node n2 (n1) as the control voltage to the gates of the transistors P0, SW1, and SW2. Therefore, the transistor P0 is set to the on state, and the transistors SW1 and SW2 that serve as the output switch elements are set to the off state.

With such a switch control part, even if the DC voltage generated at the node n1 (n2) is the negative voltage Va lower than the ground voltage VSS, it is possible to reliably set the transistor P0 to the on state and set the transistors SW1 and SW2 to the off state.

Furthermore, since the switch control part 13 (23) can be configured by the inverter composed of a pair of transistors (P1 and N1) that receive the clock signal CK1 (CK1B) with the respective gates as shown in FIG. 3, it is still possible to reduce the circuit scale and power consumption.

Figure 5:
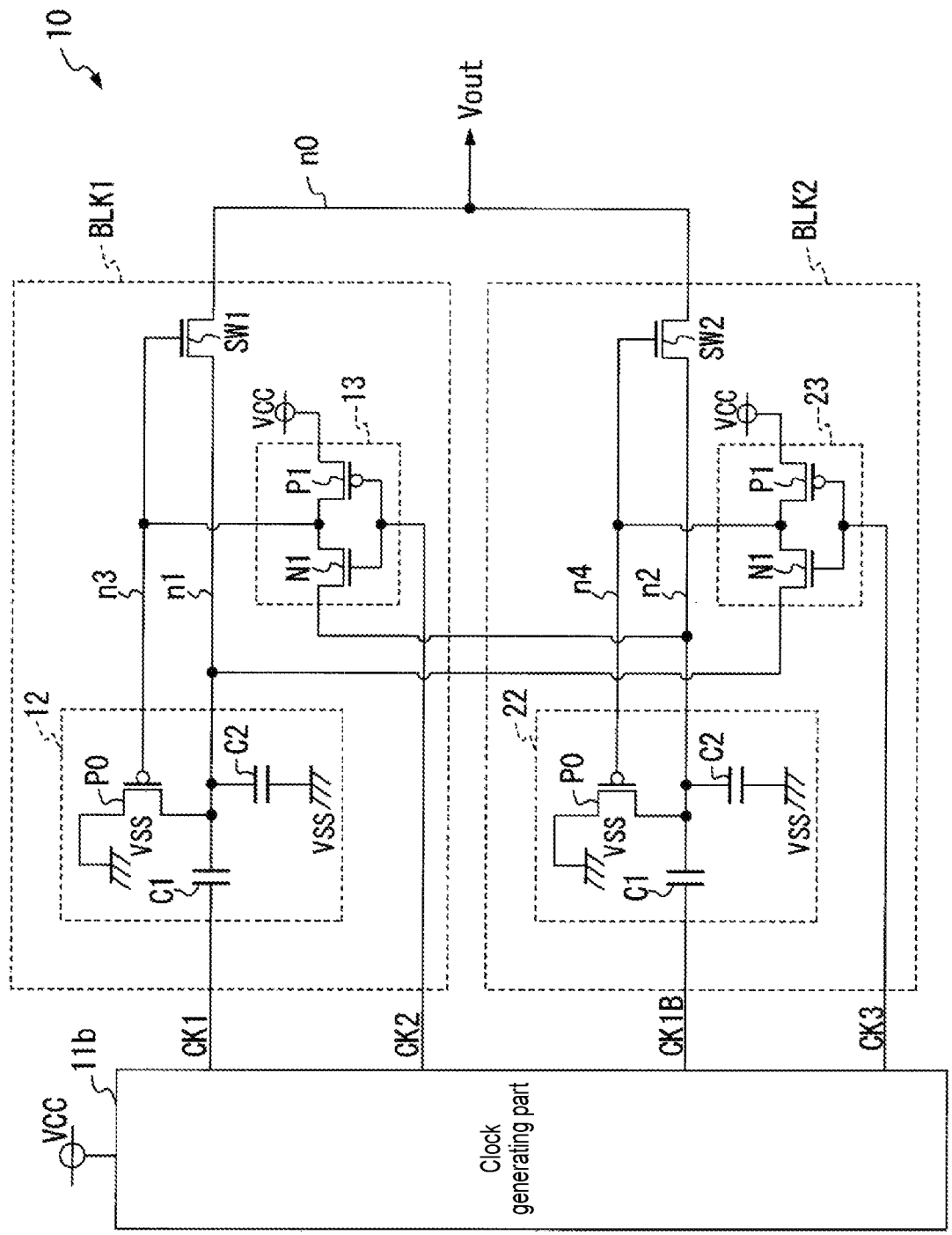
FIG. 5 is a circuit diagram showing a modified example of the voltage generating circuit 10 shown in FIG. 4.

FIG. 5 is a circuit diagram showing a modified example of the voltage generating circuit 10 shown in FIG. 3.

In the configuration shown in FIG. 5, a clock generating part 11*b* is adopted in place of the clock generating part 11*a* shown in FIG. 3. The same as the configuration shown in FIG. 3, the voltage generating circuit 10 shown in FIG. 5 includes a circuit block BLK1 and a circuit block BLK2, wherein the circuit block BLK1 includes a negative voltage generating part 12, a switch control part 13, and a transistor SW1; and the circuit block BLK2 includes a negative voltage generating part 22, a switch control part 23, and a transistor SW2.

Figure 6:
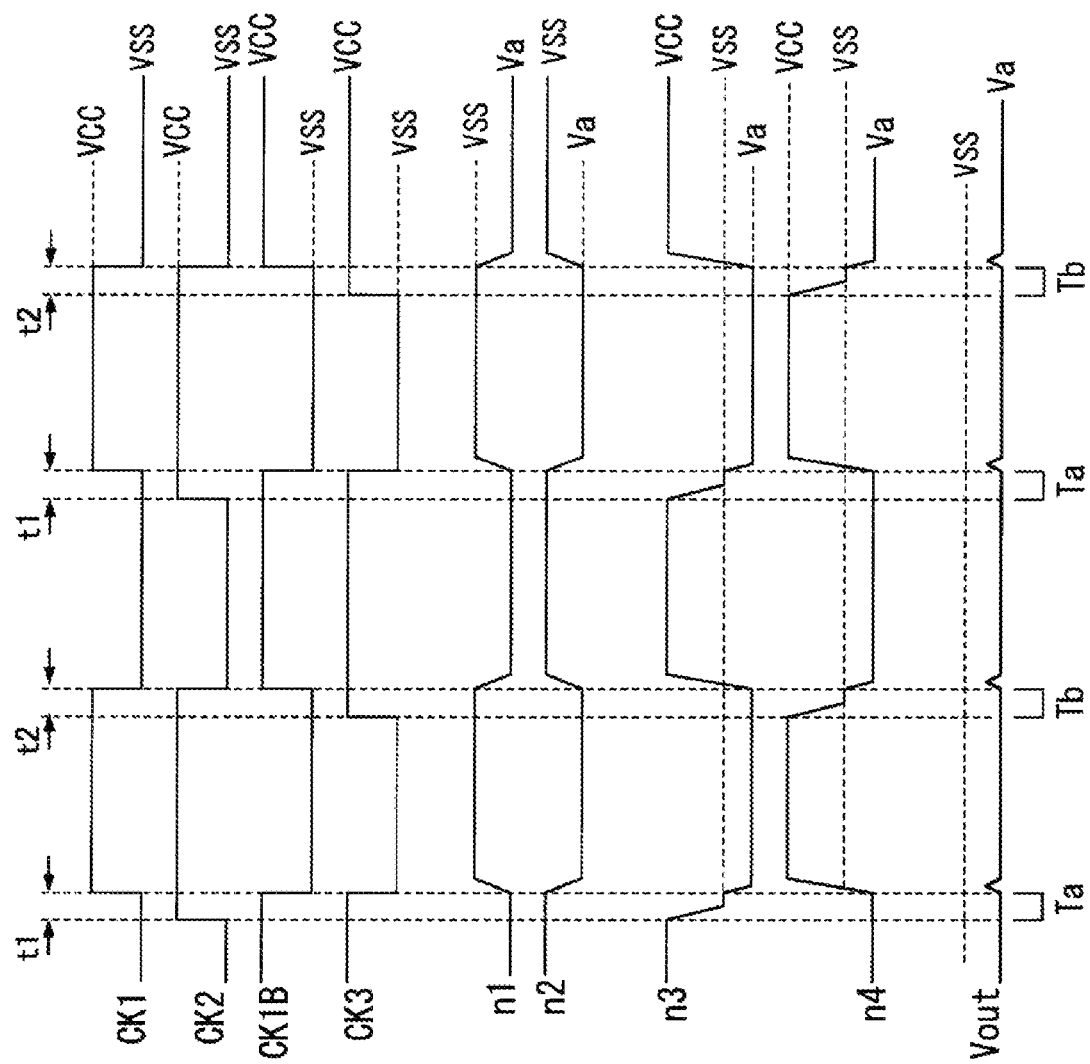
FIG. 6 is a time chart showing an example of the internal operation of the voltage generating circuit 10 shown in FIG. 5.

The clock generating part 11*b* generates the above clock signals CK1 and CK1B, and clock signals CK2 and CK3 shown in FIG. 6 as oscillation signals having the same frequency as the clock signal CK1.

As shown in FIG. 6, the phase of the rising edge of the clock signal CK2 is earlier than the phase of the rising edge of the clock signal CK1 by the time t1. However, the phase of the falling edge of the clock signal CK2 is the same as the phase of the falling edge of the clock signal CK1.

As shown in FIG. 6, the phase of the rising edge of the clock signal CK3 is earlier than the phase of the rising edge of the clock signal CK1B by the time t2. However, the phase of the falling edge of the clock signal CK3 is the same as the phase of the falling edge of the clock signal CK1B.

The clock generating part 11*b* supplies the clock signal CK1 to the capacitor C1 of the negative voltage generating part 12 and supplies the clock signal CK2 to the gates of the transistors P1 and N1 of the switch control part 13.

Furthermore, the clock generating part 11*b* supplies the clock signal CK1B to the capacitor C1 of the negative voltage generating part 22 and supplies the clock signal CK3 to the gates of the transistors P1 and N1 of the switch control part 23.

An operation of the configuration shown in FIG. 5 will be described below with reference to the time chart shown in FIG. 6. As shown in FIG. 6, the clock signal CK1 is maintained in the state of the logic level 0 in the period from the time point when the clock signal CK2 transitions from the state of the logic level 0 (VSS) to the state of the logic level 1 (VCC) to the time point when the time t1 elapses.

Thus, in the period Ta shown in FIG. 6, the transistor N1 of the switch control part 13 is in the on state, and the voltage of the node n2 of the circuit block BLK2, that is, the ground voltage VSS, is applied to the node n3. Accordingly, in the period Ta, as shown in FIG. 6, the voltage of the node n3 is temporarily maintained at the ground voltage VSS.

Subsequently, the clock signal CK1 transitions from the state of the logic level 0 to the state of the logic level 1, and the clock signal CK1B transitions from the state of the logic level 1 to the state of the logic level 0. At this time, the voltage of the node n2 of the circuit block BLK2 transitions to the negative voltage Va, and accordingly, the node n3 of the circuit block BLK1 is also in the state of the negative voltage Va.

As described above, by delaying the timing of the rising edge of the clock signal CK1 with respect to CK2, the voltage of the node n3 is temporarily lowered from the state of the power supply voltage VCC to the state of the ground voltage VSS, and this state is maintained. Therefore, in the process of generating the negative voltage at the node n2, the problem of voltage fluctuation caused by the node n2 being pulled up by the voltage of the node n3 is prevented.

Moreover, as shown in FIG. 6, the clock signal CK1B is maintained in the state of the logic level 0 in the period from the time point when the clock signal CK3 transitions from the state of the logic level 0 (VSS) to the state of the logic level 1 (VCC) to the time point when the time t2 elapses.

Thus, in the period Tb shown in FIG. 6, the transistor N1 of the switch control part 23 is in the on state, and the voltage of the node n1 of the circuit block BLK1, that is, the ground voltage VSS, is applied to the node n4. Accordingly, in the period Tb, as shown in FIG. 6, the voltage of the node n4 is temporarily maintained at the ground voltage VSS.

Subsequently, the clock signal CK1B transitions from the state of the logic level 0 to the state of the logic level 1. At this time, the voltage of the node n1 of the circuit block BLK1 transitions to the negative voltage Va, and accordingly, the node n4 of the circuit block BLK2 is also in the state of the negative voltage Va.

As described above, by delaying the timing of the rising edge of the clock signal CK1B with respect to CK3, the voltage of the node n4 is temporarily lowered from the state of the power supply voltage VCC to the state of the ground voltage VSS, and this state is maintained. Therefore, in the process of generating the negative voltage at the node n1, the problem of voltage fluctuation caused by the node n1 being pulled up by the voltage of the node n4 is prevented.

Accordingly, by adopting the configuration shown in FIG. 5, voltage fluctuation of the negative voltage generated at the nodes n1 and n2 by the negative voltage generating parts 12 and 22 can be suppressed.

Although FIG. 5 shows a configuration for a case where the disclosure is applied to the voltage generating circuit 10 that generates a negative voltage, the disclosure is also applicable to a circuit which generates a positive voltage obtained by boosting the power supply voltage.

Figure 7:
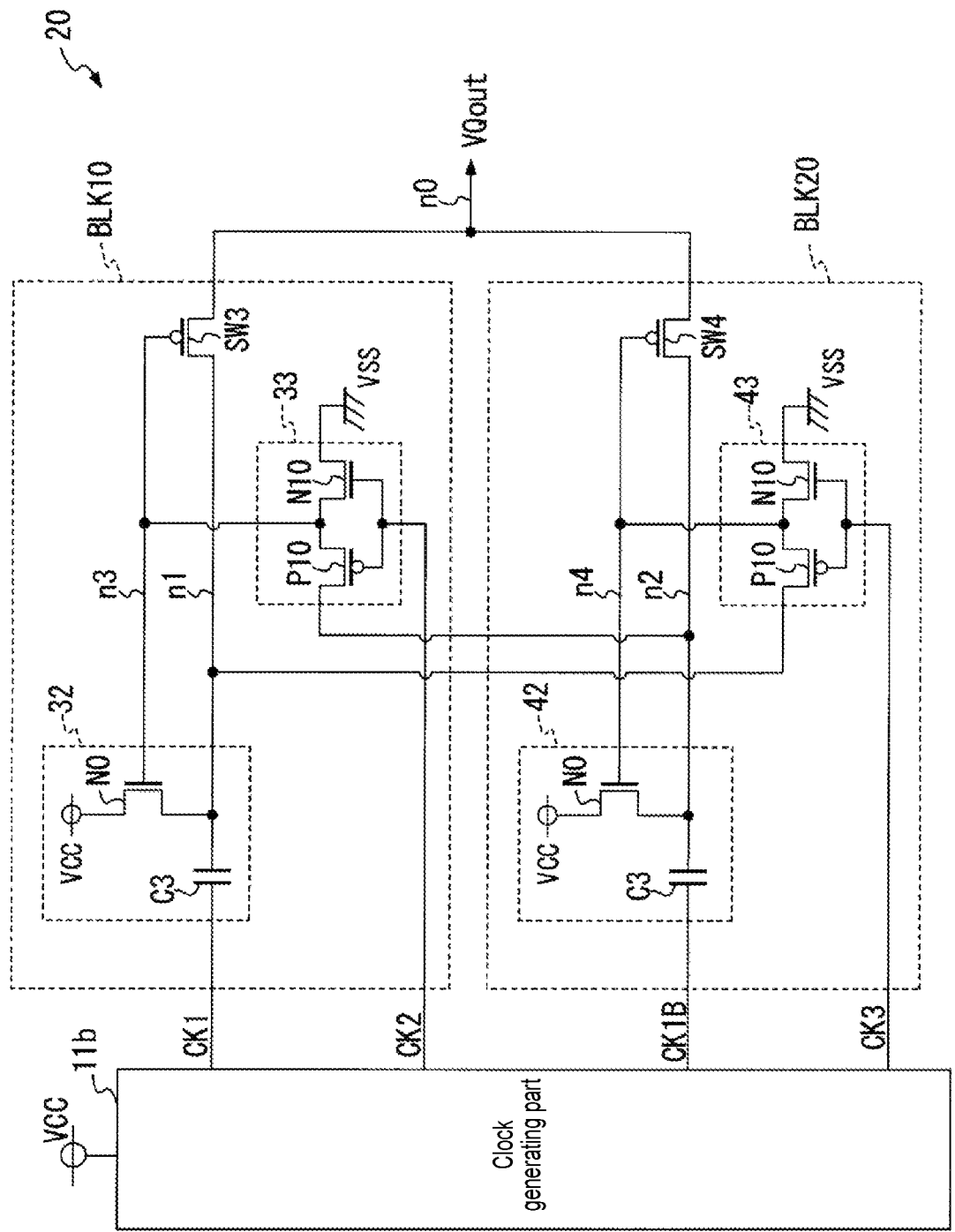
FIG. 7 is a circuit diagram showing a configuration of the voltage generating circuit 20 that generates a positive voltage obtained by boosting the power supply voltage.

FIG. 7 is a circuit diagram showing a configuration of a voltage generating circuit 20 that generates a voltage obtained by boosting the power supply voltage. The same as the configuration shown in FIG. 5, the clock generating part 11b is adopted in the configuration shown in FIG. 7, and circuit blocks BLK10 and BLK20 are adopted in place of the circuit blocks BLK1 and BLK2 shown in FIG. 5.

The circuit block BLK10 shown in FIG. 7 includes a voltage boosting part 32, a switch control part 33, and a p-channel MOS type transistor SW3 that serves as the output switch element.

The voltage boosting part 32 includes a capacitor C3 and a n-channel MOS type transistor N0. The capacitor C3 receives the clock signal CK1 at one end, and the other end thereof is connected to the node n1.

The drain of the transistor N0 is applied with the power supply voltage VCC, and the source thereof is connected to the node n1. The gate of the transistor N0 is connected to the switch control part 33 and the gate of the transistor SW3 via the node n3.

The switch control part 33 includes a p-channel MOS type transistor P10 and a n-channel MOS type transistor N10.

The gates of the transistors P10 and N10 are supplied with the clock signal CK2, and the drains of the transistors P10 and N10 are connected to the gates of the above transistors N0 and SW3 via the node n3. The source of the transistor P10 is connected to the node n2 of the circuit block BLK20, and the ground voltage VSS is applied to the source of the transistor N10. The source of the transistor SW3 is connected to the node n1, and the drain thereof is connected to the node n0.

The circuit block BLK20 includes a voltage boosting part 42, a switch control part 43, and a p-channel MOS type transistor SW4 that serves as the output switch element.

The same as the voltage boosting part 32, the voltage boosting part 42 includes a capacitor C3 and a n-channel MOS type transistor N0. The capacitor C3 of the voltage boosting part 42 receives the clock signal CK1B at one end, and the other end thereof is connected to the node n2. The drain of the transistor N0 of the voltage boosting part 42 is applied with the power supply voltage VCC, and the source thereof is connected to the node n2. The gate of the transistor N0 is connected to the switch control part 43 and the gate of the transistor SW4 via the node n4.

The same as the switch control part 33, the switch control part 43 includes a p-channel MOS type transistor P10 and a n-channel MOS type transistor N10.

The gates of the transistors P10 and N10 are supplied with the clock signal CK3, and the drains of the transistors P10 and N10 are connected to the gates of the transistor N0 of the voltage boosting part 42 and the transistor SW4 via the node n4. The source of the transistor P10 of the switch control part 43 is connected to the node n1 of the circuit block BLK10, and the ground voltage VSS is applied to the source of the transistor N10. The source of the transistor SW4 is connected to the node n2, and the drain thereof is connected to the node n0.

An operation of the voltage generating circuit 20 shown in FIG. 7 will be described below with reference to the time chart shown in FIG. 8.

Figure 8:
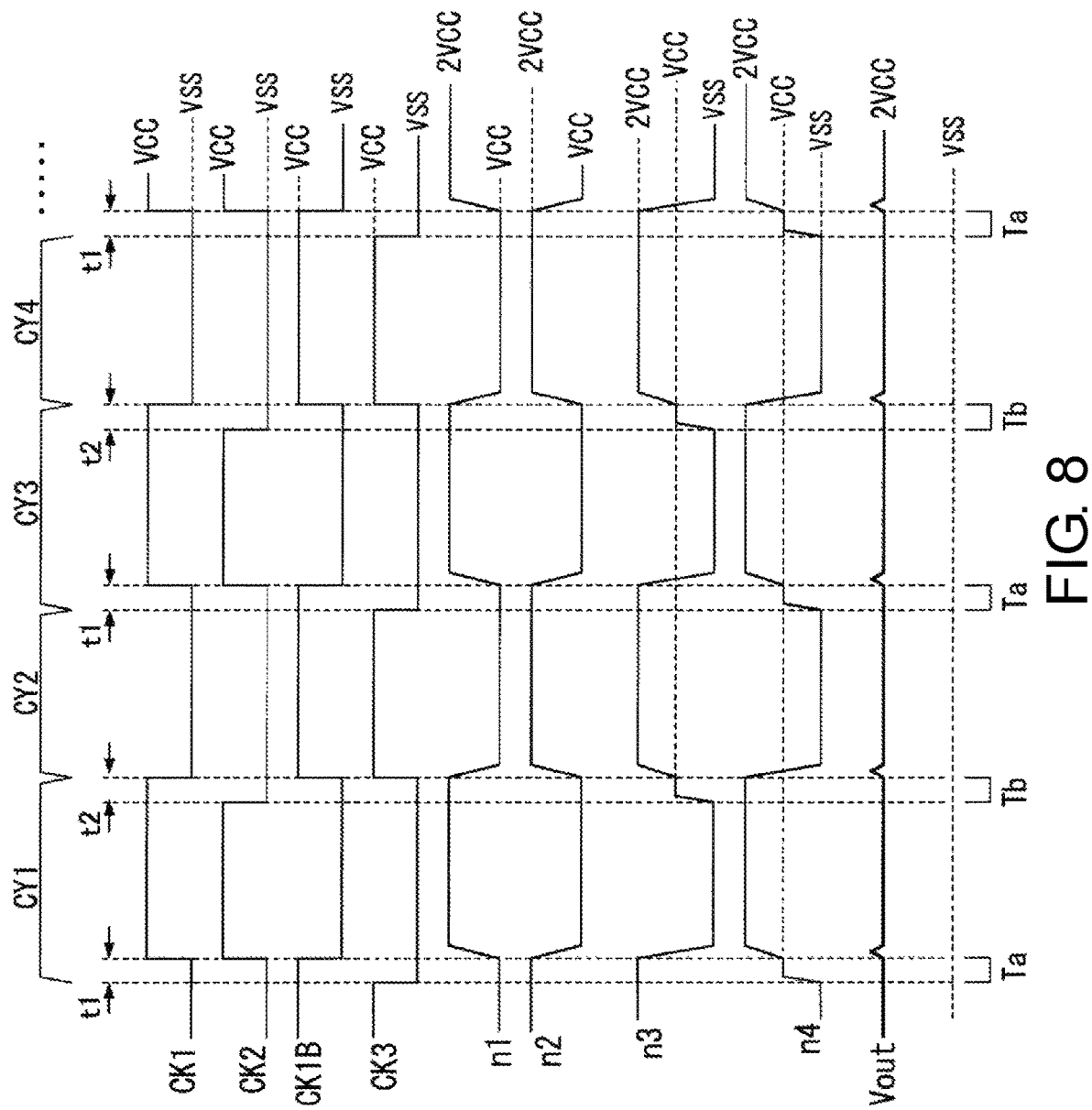
FIG. 8 is a time chart showing an example of the internal operation of the voltage generating circuit 20 shown in FIG. 7.

As shown in FIG. 8, when the clock signals CK1 and CK2 are both in the state of the ground voltage VSS and the clock signals CK1B and CK3 are both in the state of the power supply voltage VCC, the node n3 is in the state of the voltage (2·VCC). Thus, the transistor SW3 is in the off state, the transistor N0 is in the on state, and the node n1 is in the state of the power supply voltage VCC. In the meantime, the capacitor C3 of the voltage boosting part 32 is charged.

Next, when the clock signals CK1 and CK2 both transition to the state of the power supply voltage VCC and the clock signals CK1B and CK3 both transition to the state of the ground voltage VSS, since the capacitor C3 of the voltage boosting part 32 is discharged, the voltage of the node n1 is boosted to 2·VCC accordingly. Also, while the clock signal CK2 is in the state of the power supply voltage VCC, the transistor N10 of the switch control part 33 is in the on state, and the ground voltage VSS is applied to the node n3. Therefore, the transistor SW3 is in the on state, and the voltage of the node n1, that is, the voltage (2·VCC) boosted as described above is outputted as the DC voltage VQout via the node n0.

Moreover, as shown in FIG. 8, the clock generating part 11*b* transitions the clock signal CK2 from the power supply voltage VCC to the ground voltage VSS at a timing that is earlier than the time point when the clock signal CK1 is transitioned from the state of the power supply voltage VCC to the state of the ground voltage VSS by the time t2. Thus, in the period Tb shown in FIG. 8, since the clock signal CK2 is in the state of the ground voltage VSS, the transistor P10 is in the on state, and the voltage of the node n2 of the circuit block BLK20, that is, the power supply voltage VCC, is applied to the node n3. In addition, the capacitor C3 of the voltage boosting part 42 is charged by the power supply voltage VCC that is applied to the node n2.

Then, when the clock signal CK1B transitions to the state of the power supply voltage VCC, since the capacitor C3 of the voltage boosting part 42 is discharged, the voltage of the node n2 is boosted to 2·VCC accordingly. Also, since the clock signal CK2 is in the state of the ground voltage VSS in the meantime, the transistor P10 of the switch control part 33 is in the on state, and the voltage of the node n2, that is, the voltage (2·VCC), is applied to the node n3. Thus, the transistor N0 of the voltage boosting part 32 is in the on state and the transistor SW3 is in the off state.

Furthermore, since the clock signal CK3 is in the state of the power supply voltage VCC in the meantime, the transistor N10 of the switch control part 43 is in the on state, and the ground voltage VSS is applied to the node n4. Therefore, the transistor N0 of the voltage boosting part 42 is in the off state and the transistor SW4 is in the on state. Thus, the voltage (2·VCC) boosted at the node n2 as described above is outputted as the voltage VQout via the transistor SW4 and the node n0.

Thus, in the odd cycles CY1, CY3, ... shown in FIG. 8, the positive voltage (2·VCC) generated at the node n1 on the side of the circuit block BLK10 is applied to the node n0 via the transistor SW3.

On the other hand, in the even cycles CY2, CY4, ... shown in FIG. 8, the positive voltage (2·VCC) generated at the node n2 on the side of the circuit block BLK20 is applied to the node n0 via the transistor SW4.

As described above, in the voltage generating circuit 20, the circuit blocks BLK10 and BLK20 alternately generate the positive voltage (2·VCC) according to the clock signals CK1, CK1B, CK2, and CK3. At this time, the circuit blocks BLK10 and BLK20 alternately apply the positive voltage (2·VCC) generated thereby to the node n0, so as to output the positive voltage (2·VCC) as the DC voltage Vout.

Here, in the voltage generating circuit 20, the transistor N0, which is in the off state when the clock signal CK2 (CK3) is in the state of the power supply voltage VCC and is in the on state to apply the power supply voltage VCC to the node n1 (n2) when the clock signal CK2 (CK3) is in the state of the ground voltage VSS is controlled as follows.

That is, when the clock signal CK2 (CK3) is in the state of the power supply voltage VCC, the switch control part 33 (43) supplies the ground voltage VSS as the control voltage to the gates of the transistors N0, SW3, and SW4. Therefore, the transistor N0 is set to the off state, and the transistors SW3 and SW4 that serve as the output switch elements are set to the on state. On the other hand, when the clock signal CK2 (CK3) is in the state of the ground voltage VSS, the switch control part 33 (43) supplies the voltage of the node n2 (n1) as the control voltage to the gates of the transistors N0, SW3, and SW4. Therefore, the transistor N0 is set to the on state, and the transistors SW3 and SW4 that serve as the output switch elements are set to the off state.

According to the operation of the switch control part 33 (43), even if the DC voltage generated at the node n1 (n2) is a voltage higher than the power supply voltage VCC, it is possible to reliably set the transistor N0 to the on state and set the transistors SW3 and SW4 that serve as the output switch elements to the off state.

Furthermore, since the switch control part 33 (43) can be configured by the inverter composed of a pair of transistors (P10, N10) that receive the clock signal CK2 (CK3) with the respective gates as shown in FIG. 7, it is possible to reduce the circuit scale and power consumption.

Although, in the configuration shown in FIG. 7, the positive voltage (2·VCC) is alternately generated by two systems, that is, the circuit blocks BLK10 and BLK20, the voltage generating circuit 20 may be configured by only one system of the circuit blocks BLK10 and BLK20. For example, in the case where the voltage generating circuit 20 is configured by only the circuit block BLK10, the source of the transistor P10 of the switch control part 33 is connected to the node n1.

In short, the voltage generating circuit according to the disclosure includes an oscillation signal generating part, a capacitor, a switch element, and a switch control part as described below.

In other words, the oscillation signal generating part (11, 11*a*, 11*b*) generates an oscillation signal (CK1, CK1B, CK2, CK3) that alternately repeats the state of the first voltage (for example, one voltage of VCC and VSS) and the state of the second voltage (for example, the other voltage of VCC and VSS). The capacitor receives the oscillation signal at one end, and an output node (n1, n2, n0) at which the DC voltage is generated is connected to the other end of the capacitor. The switch element (P0, N0) receives the control voltage (Va, VSS, VCC, 2·VCC) and is set to the on state or the off state according to the control voltage, and applies the first voltage to the output node when set to the on state. The switch control part (13, 23, 33, 43) sets the switch element to the off state by supplying the second voltage as the control voltage to the switch element when the oscillation signal is in the state of the first voltage. In addition, the switch control part (13, 23, 33, 43) sets the switch element to the on state by supplying the voltage of the output node as the control voltage to the switch element when the oscillation signal is in the state of the second voltage.

What is claimed is:

1. A voltage generating circuit for generating a DC voltage at an output node, comprising:

an oscillation signal generating part generating a first clock signal and a second clock signal having different phases from each other, and the first clock signal and the second clock signal alternately repeat a state of a first voltage and a state of a second voltage;

a capacitor having one end receiving the first clock signal and an other end connected to the output node;

a switch element receiving a control voltage and set to an on state or an off state according to the control voltage, and applying the first voltage to the output node when set to the on state; and a switch control part receiving the second clock signal, and setting the switch element to the on state by supplying the second voltage as the control voltage to the switch element when the first clock signal is in the state of the second voltage, and setting the switch element to the off state by supplying a voltage of the output node as the control voltage to the switch element when the first clock signal is in the state of the first voltage.

2. The voltage generating circuit according to claim 1, wherein the switch element is a transistor, the first voltage is applied to a drain of the transistor, and a source of the transistor is connected to the output node, and the switch control part comprises a pair of transistors that receive the second clock signal with respective gates and have respective drains connected to a gate of the transistor, wherein the second voltage is applied to a source of one of the pair of transistors, and a source of an other one of the pair of transistors is connected to the output node.

3. The voltage generating circuit according to claim 1, wherein the second voltage is a positive voltage higher than the first voltage, and
the DC voltage is a negative voltage.

4. The voltage generating circuit according to claim 1, wherein the first voltage is a positive voltage higher than the second voltage, and
the DC voltage is a voltage higher than the first voltage.

5. A voltage generating circuit for generating a DC voltage at an output node, comprising:
an oscillation signal generating part generating a first clock signal and a second clock signal having different phases from each other, and the first clock signal and the second clock signal alternately repeat a state of a first voltage and a state of a second voltage, and the second clock signal is obtained by inverting a phase of the first clock signal;
a first node and a second node;
a first capacitor having one end receiving the first oscillation clock signal and an other end connected to the first node;
a second capacitor having one end receiving the second oscillation clock signal and an other end connected to the second node;
a first switch element set to an on state or an off state according to a first control voltage and applying the first voltage to the first node when set to the on state;
a second switch element set to an on state or an off state according to a second control voltage and applying the first voltage to the second node when set to the on state;
a first switch control part receiving the first clock signal, and setting the first switch element to the on state by supplying the second voltage as the first control voltage to the first switch element when the first clock signal is in the state of the second voltage, and setting the first switch element to the off state by supplying a voltage of the second node as the first control voltage to the first switch element when the first clock signal is in the state of the first voltage;
a second switch control part receiving the second clock signal, and setting the second switch element to the on state by supplying the second voltage as the second control voltage to the second switch element when the second clock signal is in the state of the second voltage, and setting the second switch element to the off state by supplying a voltage of the first node as the second control voltage to the second switch element when the second clock signal is in the state of the first voltage;
a first output switch element being in an on state to apply the voltage of the first node to the output node only when the first control voltage is in the state of the second voltage; and
a second output switch element being in an on state to apply the voltage of the second node to the output node only when the second control voltage is in the state of the second voltage.

6. A voltage generating circuit for generating a DC voltage at an output node, comprising:
an oscillation signal generating part generating a first oscillation clock signal that alternately repeats a state of a first voltage and a state of a second voltage, a second clock signal that advances a phase of a rising edge of the first clock signal by a predetermined time, a third clock signal obtained by inverting a phase of the first clock signal, and a fourth clock signal that advances a phase of a rising edge of the third clock signal by the predetermined time;
a first node and a second node;
a first capacitor having one end receiving the first clock signal and an other end connected to the first node;
a second capacitor having one end receiving the third clock signal and an other end connected to the second node;
a first switch element set to an on state or an off state according to a first control voltage and applying the first voltage to the first node when set to the on state;
a second switch element set to an on state or an off state according to a second control voltage and applying the first voltage to the second node when set to the on state;
a first switch control part receiving the second clock signal, and setting the first switch element to the on state by supplying the second voltage as the first control voltage to the first switch element when the second clock signal is in the state of the second voltage, and setting the first switch element to the off state by supplying a voltage of the second node as the first control voltage to the first switch element when the second clock signal is in the state of the first voltage;
a second switch control part receiving the fourth clock signal, and setting the second switch element to the on state by supplying the second voltage as the second control voltage to the second switch element when the fourth clock signal is in the state of the second voltage, and setting the second switch element to the off state by supplying a voltage of the first node as the second control voltage to the second switch element when the fourth clock signal is in the state of the first voltage;
a first output switch element being in an on state to apply the voltage of the first node to the output node only when the first control voltage is in the state of the second voltage; and
a second output switch element being in an on state to apply the voltage of the second node to the output node only when the second control voltage is in the state of the second voltage.

7. A semiconductor memory device, comprising:
a plurality of memory cells; and
a voltage generating circuit generating a voltage for writing data to or reading data from the memory cells,
wherein the voltage generating circuit comprises:
an oscillation signal generating part generating a first clock signal and a second clock signal having different phases from each other, and the first clock signal and the second clock signal alternately repeat a state of a first voltage and a state of a second voltage;
a capacitor having one end receiving the first clock signal and an other end connected to an output node;
a switch element receiving a control voltage and set to an on state or an off state according to the control voltage, and applying the first voltage to the output node when set to the on state; and
a switch control part receiving the second clock signal, and setting the switch element to the on state by supplying the second voltage as the control voltage to the switch element when the first clock signal is in the state of the second voltage, and setting the switch element to the off state by supplying a voltage of the output node as the control voltage to the switch element when the first clock signal is in the state of the first voltage.

8. A voltage generating method of a voltage generating circuit, which comprises an oscillation signal generating part generating a first clock signal and a second clock signal having different phases from each other, and the first clock signal and the second clock signal alternately repeat a state of a first voltage and a state of a second voltage; a capacitor having one end receiving the first clock signal and an other end connected to an output node; and a switch element receiving a control voltage and set to an on state or an off state according to the control voltage, and applying the first voltage to the output node when set to the on state, the voltage generating method comprising:

setting the switch element to the on state by supplying the second voltage as the control voltage to the switch element when the first clock signal is in the state of the second voltage; and setting the switch element to the off state by supplying a voltage of the output node as the control voltage to the switch element when the first clock signal is in the state of the first voltage.

* * * * *